US 9,548,323 B2

(12) United States Patent
Cho

(10) Patent No.: US 9,548,323 B2
(45) Date of Patent: *Jan. 17, 2017

(54) THIN FILM TRANSISTOR DISPLAY PANEL AND METHOD OF MANUFACTURING THE SAME

(71) Applicant: SAMSUNG DISPLAY CO., LTD., Yongin, Gyeonggi-Do (KR)

(72) Inventor: Young-Joon Cho, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/709,144

(22) Filed: May 11, 2015

(65) Prior Publication Data

US 2015/0243680 A1    Aug. 27, 2015

Related U.S. Application Data

(63) Continuation of application No. 12/818,031, filed on Jun. 17, 2010, now Pat. No. 9,030,395.

(30) Foreign Application Priority Data

Nov. 5, 2009 (KR) .................. 10-2009-0106621

(51) Int. Cl.
*H01L 27/12* (2006.01)
*G09G 3/36* (2006.01)
*G02F 1/1362* (2006.01)

(52) U.S. Cl.
CPC ........... *H01L 27/124* (2013.01); *G09G 3/3648* (2013.01); *G09G 3/3655* (2013.01); *G02F 1/136286* (2013.01); *G09G 2300/043* (2013.01); *G09G 2300/0426* (2013.01); *G09G 2310/0251* (2013.01); *G09G 2310/0286* (2013.01); *G09G 2310/0297* (2013.01); *G09G 2320/0209* (2013.01)

(58) Field of Classification Search
CPC .......................... G09G 3/3648; H01L 27/124
See application file for complete search history.

(56) References Cited

U.S. PATENT DOCUMENTS

| 5,151,689 | A  | 9/1992 | Kabuto et al. |
| 6,177,970 | B1 | 1/2001 | Kim |
| 6,707,441 | B1 | 3/2004 | Hebiguchi et al. |
| 7,176,990 | B2 | 2/2007 | Choi et al. |

(Continued)

FOREIGN PATENT DOCUMENTS

| JP | 3091300 | 7/2000 |
| KR | 10-2005-0101672 | 10/2005 |

(Continued)

*Primary Examiner* — Fred Tzeng
(74) *Attorney, Agent, or Firm* — Innovation Counsel LLP

(57) ABSTRACT

A thin film transistor array panel includes: a first gate line extending in a first direction; a second gate line extending in the first direction; a data line extending in a different second direction; a first common signal distribution line including a plurality of first branches connected to each other, wherein the first branches extend in the second direction and intersect under or over with the first gate line and the second gate line. The first branches are connected to receive an electrostatic offset voltage of polarity opposite to that of data line voltages supplied on the data line. A column of pixel-electrodes are sandwiched between the data line and one of the first branches.

17 Claims, 7 Drawing Sheets

(56) References Cited

U.S. PATENT DOCUMENTS

| | | |
|---|---|---|
| 7,292,302 B2 | 11/2007 | Min et al. |
| 7,385,576 B2 | 6/2008 | Moon |
| 7,907,107 B2 | 3/2011 | Jeon |
| 8,063,860 B2 | 11/2011 | Choi et al. |
| 8,164,562 B2 | 4/2012 | Lee et al. |
| 8,274,460 B2 | 9/2012 | Moon |
| 2002/0047827 A1 | 4/2002 | Koyama et al. |
| 2006/0284815 A1 | 12/2006 | Kwon et al. |
| 2007/0046609 A1 | 3/2007 | Lee |
| 2009/0290081 A1 | 11/2009 | Cho et al. |

FOREIGN PATENT DOCUMENTS

| | | |
|---|---|---|
| KR | 10-2007-0071448 | 7/2007 |
| KR | 10-2007-0072113 | 7/2007 |
| KR | 10-2008-0051743 | 6/2008 |
| KR | 10-2009-0015737 | 2/2009 |

THIN FILM TRANSISTOR DISPLAY PANEL AND METHOD OF MANUFACTURING THE SAME

CROSS-REFERENCE TO RELATED APPLICATION

This application is a continuation application of U.S. patent application Ser. No. 12/818,031 filed Jun. 17, 2010, which claims priority to and the benefit of Korean Patent Application No. 10-2009-0106621 filed in the Korean Intellectual Property Office on Nov. 5, 2009, the entire contents of which application are incorporated herein by reference.

BACKGROUND (a) Field of Disclosure

A thin film transistor array panel and a manufacturing method thereof are provided.

(b) Description of Related Technology

In general, a flat panel display such as a liquid crystal display (LCD), or an organic light emitting diode (OLED) display, or an electrophoretic display includes opposed electrodes between which an electric field is generated and one or more electro-optical active layers disposed to be affected by the generated field. The typical LCD includes a liquid crystal layer interposed as the electro-optical active layer between a pixel-electrode and an opposed section of a common electrode. The typical OLED display includes an organic light emitting layer as the electro-optical active layer. Generally one of electric field generating electrodes is referred to as the pixel-electrode and it is generally connected to a switching element (e.g., a transistor) so as to receive an image specifying electrical signal through the switching element. The electro-optical active layer responds to the received electrical signal by forming a corresponding optical signal, thereby displaying a corresponding portion of an image.

Typically, the flat panel display device includes a display panel having a plurality of pixel units arranged in a display area in the form of a matrix, and each pixel unit includes a pixel electrode, a corresponding portion of the common electrode, and a thin film transistor acting as the switching element and connected to the pixel electrode. A gate electrode of the thin film transistor is connected to a corresponding gate line to receive therefrom a row-activating gate signal produced by a gate driver circuit. A source electrode of the thin film transistor is connected to a corresponding data line to receive therefrom a data signal produced by a data driver circuit. The thin film transistor (TFT) operates to selectively couple the received data signal to the pixel electrode of its pixel unit when an activating gate signal is received. Each pixel unit of the display device may output light of one of primary colors such as red, green, and blue, and in some cases additional colors are included such as a white output. An appropriately dyed color filter may be positioned over the pixel unit for outputting the desired spectrum of wavelengths. Alternatively, a color specific emission layer material may be disposed within the pixel unit for emitting the pixel's uniquely colored spectrum of light wavelengths.

In the typical liquid crystal display, the polarity of the applied pixel-electrode voltage, that is the voltage developed between the pixel electrode and the common electrode, is periodically reversed in order to prevent image deterioration due to long-time application of a unidirectional electric field, etc. In other words, the polarities of the supplied data voltages with respect to the common voltage are reversed every frame, or every row, or for every next pixel as examples of such periodic polarity reversals.

The gate driver circuits and the data driver circuits of the display device generally include a plurality of driver ICs. The cost, in particular of the data line driver ICs, tends to be high such that it is desirable to find ways to reduce the number of data driver ICs used in the display device and thus reduce overall cost and complexity. One method of reducing the number of the data driving ICs, is to reduce the number of the data lines provided relative to the number of pixels driven. In one such implementation gate lines and TFTs are clustered close together. This creates a form of asymmetry in the structure because the positions of the thin film transistors are not consistently the same for every pixel. Vertical line blurs may appear due to localized electric field influences between adjacent pixels due to asymmetry and may become perceptible. Artifacts may also develop due to polarity reversal driving (inversion driving).

The above information disclosed in this Background section is only for enhancement of understanding of the related technology and therefore it may contain information that does not form the prior art and is already known to persons of ordinary skill in the pertinent art.

SUMMARY

A thin film transistor array panel according to an exemplary embodiment of the present disclosure includes: a first gate line extending in a first direction; a second gate line extending in the first direction; a data line extending in a second direction; a first common signal distribution line including a plurality of first branches connected to each other, wherein the first branches extend in the second direction to intersect under or over with the first gate line and the second gate line; a first thin film transistor connected to the first gate line and the data line; a second thin film transistor connected to the second gate line and the data line; a first pixel electrode connected to the first thin film transistor; and a second pixel electrode connected to the second thin film transistor.

The data line may receive a plurality of data voltages during one frame, and the first common signal distribution line may receive a first voltage during the same one frame. The polarity of the plurality of data voltages may be inverted for a period of one frame, and the first voltage may have opposite polarity to that of the data voltages so that the first voltage offsets electrostatic influences of the data voltages on pixel-electrodes sandwiched between each data line and an opposed common signal distribution line.

The first gate line may be applied with a first gate-on signal, the second gate line may be applied with a second gate-on signal, the first gate-on signal may be applied earlier than the second gate-on signal, and the first gate-on signal and the second gate-on signal may overlap during a predetermined time.

The first gate-on signal and the second gate-on signal may be respectively applied during one horizontal period.

The first gate-on signal and the second gate-on signal may overlap during half of a horizontal period.

The first common signal distribution line may include a second branch, the second branch may be positioned in the peripheral area, and the second branch may be connected to the first branch.

A second common signal distribution line including a plurality of third branches connected to each other, the third branches extending in the second direction and intersecting the first gate line and the second gate line, may be further included.

The data line may receive a plurality of data voltages during one frame, the first common signal distribution line may receive a first voltage during one frame, and the second common signal distribution line may receive a second voltage during the same one frame. The polarity of the plurality of data voltages may be inverted for a period of one frame, and the first and second voltages may have opposite polarity to that of the data voltages.

The data line may be positioned between the first branch and the second branch such that pixel columns are each sandwiched either between the data line and the first branch ('A' branch) or between the data line and the second branch ('B' branch).

The first thin film transistor may include a first gate electrode, a first source electrode and a first drain electrode, the first drain electrode may be connected to the first pixel electrode, the second thin film transistor may include a second gate electrode, a second source electrode, and a second drain electrode, and the second drain electrode may be connected to the second pixel electrode.

The data line may be positioned on the first gate line and the second gate line, and the first common signal distribution line may be formed with the same layer as the data line.

A storage electrode line positioned with the same layer as the first gate line and the second gate line may be included.

The storage electrode line may include a storage electrode overlapping the data line. The storage electrode line may overlap the pixel electrode.

DETAILED DESCRIPTION OF THE EMBODIMENTS

Figure 1:
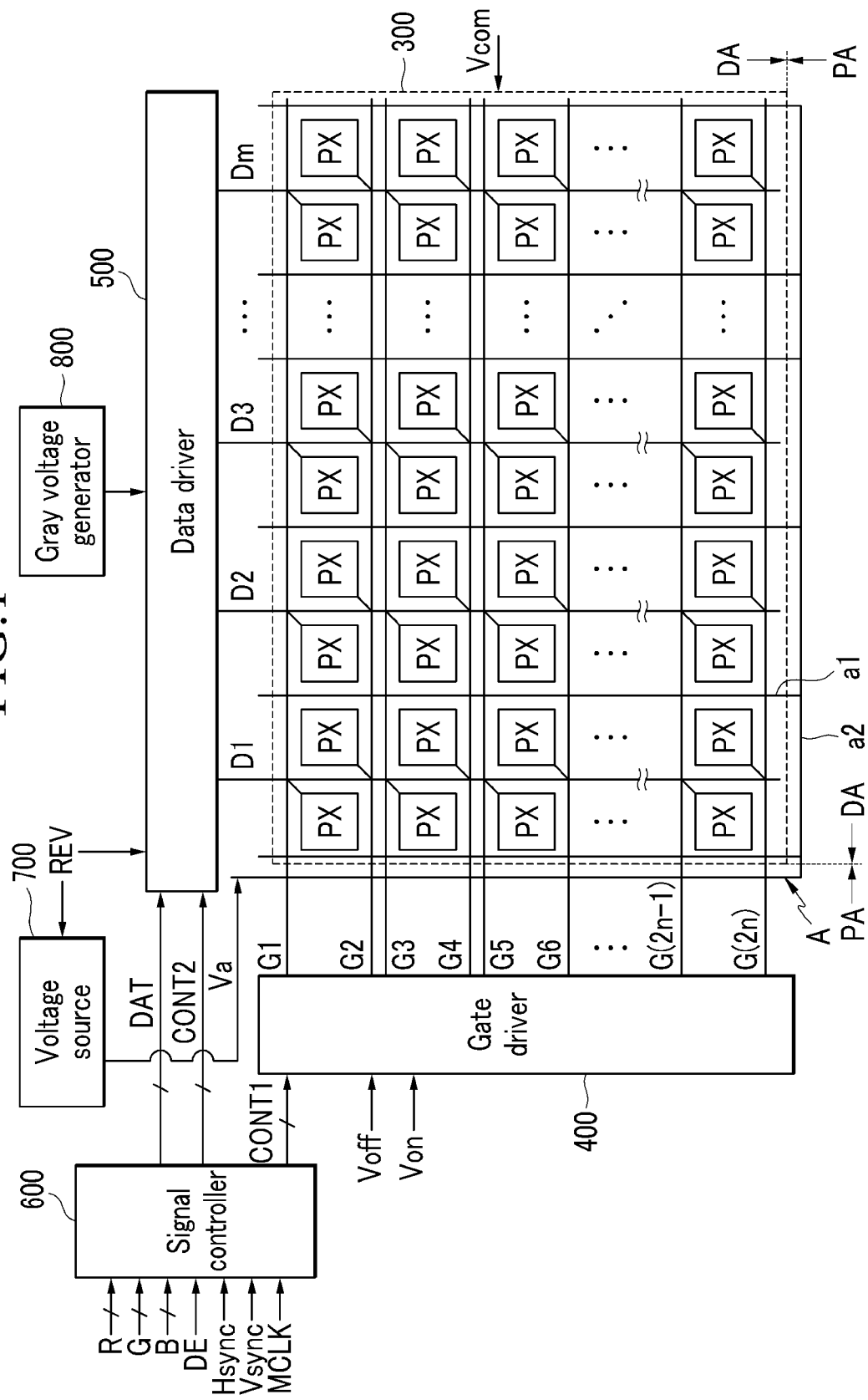
FIG. 1 is a block diagram of a display device including a thin film transistor array panel according to a first exemplary embodiment of the present disclosure.

The present disclosure of invention will be provided more fully hereinafter with reference to the accompanying drawings, in which exemplary embodiments are shown. As those skilled in the pertinent art would realize from the here provided teachings, the described embodiments may be modified in various different ways, all without departing from the spirit or scope of the present teachings. In the drawings, irrelevant portions are omitted to clearly describe the present disclosure, and like reference numerals generally designate like elements throughout the specification.

Furthermore, detailed descriptions are not given to the well-known aspects of the pertinent art.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "under" another element, it can be directly under the other element or intervening elements may also be present. On the contrary, when an element is referred to as being "directly under" another element, there are no intervening elements present.

Now, a thin film transistor array panel and a display device including the same according to an exemplary embodiment of the present disclosure will be described with reference to FIG. 1.

FIG. 1 is a block diagram of a display device including a thin film transistor array panel according to an exemplary embodiment.

As shown in FIG. 1, a display device according to an exemplary embodiment of the present disclosure includes a display panel assembly 300, a gate driver circuit 400 and a data driver circuit 500 connected to corresponding gate lines and data lines of the display panel assembly 300. The display panel assembly 300 further includes a gray voltage generator circuit 800 connected to the data driver circuit 500, and a signal controller 600 coupled to the gate and data driver circuits for controlling them. At least one of the gate driver 400 and the data driver 500 may be mounted as a chip-on-glass (COG) type of monolithic integrated circuit bonded to the display panel assembly 300.

As already partly mentioned, the display panel assembly 300 includes a plurality of respective gate and data lines, G1 to G($2n$) and D1-Dm, and a plurality of pixel units PX that are connected thereto and arranged in an approximately regular matrix form.

For color displays, each pixel unit uniquely displays a respective one of at least three primary colors. A desired color is recognized by the human visual system as a spatial and/or temporal sum of the displayed primary colors. For example, the primary colors include the three primary colors of red, green, and blue.

The display signal lines G1-G($2n$) and D1-Dm include the plurality of gate lines G1 to G($2n$) for transmitting gate signals (referred to also as "scanning signals"), and the plurality of data lines D1 to Dm for transmitting data voltages to the pixel units. The gate lines G1 to G($2n$) are arranged in parallel with each other and extend approximately in a row direction, and the data lines D1 to Dm are arranged in parallel with each other and extend approximately in a column direction.

Each pixel unit PX includes a pixel electrode (not explicitly shown in FIG. 1) for receiving a data line signal and a common electrode (not shown) facing the pixel electrode and receiving a common voltage Vcom. Each pixel unit PX may include a switching element (not shown) such as a thin film transistor connected to the display signal lines G1 to G$2n$ and D1 to Dm. The pixel unit PX is connected to the gate lines G1 to G2n and the data lines D1 to Dm through the switching element, and receives the data signal therethrough.

In the illustrated embodiment of FIG. 1, where this is true for most but not all rows, a clustered together pair of gate lines $G_{2i}$ and $G_{(2i+1)}$ (i=1, 2, ..., n-1) is disposed either above or below a respectively controlled row of pixel units. For example, each odd numbered one of gate line pairs $G_1$ and $G_2$, $G_3$ and $G_4$, ..., or $G_{2i-1}$ and $G_{2i}$, connects to a first subset of pixel units PX in the row below that odd numbered gate line and each even numbered one of gate line pairs (e.g., $G_1$ and $G_2$) connects to a second subset of pixel units PX in the same row, where that pixel row is disposed above the even numbered gate line (e.g., $G_2$, $G_4$, ..., $G_{2i}$).

Each of the data lines, D1-Dm is disposed between and shared by two pixel columns. That is, one of the data lines, say D1, is disposed between the first two pixel columns, and the pixel units PX of the first two pixel columns receive their data signals from that single shared data line (D1). More generally, the pixels PX of odd-numbered columns are each connected to the data line at their respective right side. On the other hand, the pixel units PX of the even-numbered columns are each connected to the data line at their respective left side.

Through this arrangement, the number of the data lines D1 to Dm may be reduced to being half of the number of pixel columns provided in the display area.

A common signal distribution line 'A' is provided on the display panel assembly 300 where the common signal distribution line 'A' includes a plurality of branches such as a vertical first branch $a_1$ and a horizontal second branch $a_2$. The first branch a1 and the second branch a2 are connected to each other, thereby distributing a received one common voltage, Va. The supplied common voltage, Va may be provided from a voltage source (700) that is responsive to a polarity reversal control signal, REV, of the system. The vertical first branch a1 extends in the direction approximately parallel to the data lines D1 to Dm, and is disposed between neighboring two data lines of the data lines D1 to Dm. For example, in FIG. 1, the so referenced first branch a1 is disposed between the second illustrated column of pixels PX and the third illustrated column of pixels. At the same time, none of the data lines D1 to Dm are disposed between the second and third illustrated columns of pixels PX. The first branch a1 is insulated from and intersects under or over the gate lines G1 to G(2n)). The common signal distributing, second branch a2 is disposed at a peripheral area PA of the display device outside of its display area (DA), and in one embodiment the second branch a2 continues from the bottom PA to left and right PA's to thereby enclose approximately ¾ths of the circumference of the display area (DA). Incidentally, as shown in FIG. 1, the display panel assembly 300 may be divided into a display area DA and one or more peripheral areas PA. Here, the display area DA is a region displaying images and including all image displaying pixel units PX. The peripheral area(s) PA is/are disposed along peripheral edge(s) of the display area DA.

The connected-to data lines, D1 to Dm, are disposed at either the right side or left side of each respective pixel unit PX, while the voltage first branch a1 of the common signal distribution line 'A' is disposed at the other side. That is, the data lines D1 to Dm and the first branches a1 are alternated so as to be disposed at the opposed right and left sides of each respective pixel unit PX. The voltage Va applied to the common signal distribution line 'A' (see briefly the dual polarity Va signal waveform of FIG. 3) may be such that electrical crosstalk influence from modulated ones of the data lines D1 to Dm, except for the data line (Dj) of the given pixel PXj are substantially blocked out by the more localized and AC absorbing influence of the adjacent first branch a1 of the given pixel PXj. Accordingly, the image-forming data signal voltage applied to the pixel-electrode of the given pixel PXj is substantially shielded from parasitic capacitance coupled influence of other data lines, thereby reducing the appearance of vertical blurs on the display screen. The pixel electrode voltage of each respective PXj may be little changed by the substantially DC signal on the adjacent common signal distribution line (a1) particularly if the voltage Va on that adjacent line (a1) is of opposite polarity. Capacitive coupling to nearby and crossing under or over gate lines also helps reduce the generation of undesired gradual greenish hues and gradual reddish hues. Here, the gradual greenish hue and the gradual reddish hue are blurs that may be caused when the pixels PX of one row are gradually brightened when the gate turn-on voltage ($V_{gON}$) is applied late in a pixel row, where the level of $V_{gON}$ may gradually increase near an edge of the screen due to delay or resonance of high frequency components of a gate signal along the applied-to gate line. Such a nonuniform distribution of the $V_{gON}$ level to different pixels across the screen may result in a significant change amount of the affected pixel voltages, and the gradual greenish hue and the gradual reddish hue artifacts may be serious ones. However, the network of vertical a1 distribution lines can help to absorb high frequency components of the gate signal along the applied-to gate line and thus reduce the appearance of the gradual greenish hue and the gradual reddish hue artifacts.

As seen in FIG. 1, the gate driver 400 is connected to the gate lines G1 to G(2n) of the display panel assembly 300. The gate driver 400 applies gate turn-on signal pulses to the gate lines G1 to G(2n). For example, the gate driver 400 may apply a gate signal pulse whose waveform includes a combination of the gate-on voltage $V_{Gon}$ turning on the switching element and the gate-off voltage $V_{Goff}$ turning it off to the gate lines G1 to G(2n). ($V_{Gon}$ and $V_{Goff}$ are shown in FIG. 1 as Von and Voff and are understood to be analog DC voltages supplied from an appropriate power supply (not shown).

The data driver 500 is connected to the data lines D1 to Dm of the display panel assembly 300 and is structured to apply appropriate analog data voltage levels to the data lines D1 to Dm depending on the luminance desired for the given pixel.

The signal controller 600 is supplied with digital input image defining signals R, G, and B and input control signals for controlling the display thereof such as a vertical synchronization signal Vsync, a horizontal synchronization signal Hsync, a main clock signal MCLK, and a data enable signal DE from an external graphics controller (not shown). The signal controller 600 processes the image signals R, G, and B according to extant operating conditions of the liquid crystal panel assembly 300 and on the basis of the input image signals R, G, and B and the input control signals, the controller 600 generates a gate control signal CONT1 and a data control signal CONT2. Then, the signal controller 600 supplies the gate control signal CONT1 to the gate driver 400 and supplies the data control signal CONT2 and the processed image signal DAT to the data driver 500. Here, the processing of the image signals R, G, and B may include an operation of rearranging the image data R, G, and B according to the arrangement of the pixels of the display panel assembly 300 of FIG. 2.

The gate control signal CONT1 includes a scanning start signal STV for instructing to start scanning and at least one clock signal for controlling an output cycle of the gate-on voltage Von. The gate control signal CONT1 may further include an output enable signal for limiting duration of the gate-on voltage Von.

The data control signal CONT2 includes a horizontal synchronization start signal informing about starting of transmission of the data with respect to one row of pixels PX and a load signal instructing application of a corresponding data voltage to the data lines D1-Dm and a data clock signal. The data control signal CONT2 may further include an inversion signal for inverting the polarity of the data voltage with respect to the common voltage Vcom (where "polarity of the data voltage with respect to the common voltage" will also be referred to as "polarity of the data voltage" hereinafter).

The data driver 500 sequentially receives groups of image data DAT for a row of pixels in response to the data control signal CONT2 transmitted from the signal controller 600, and selects a gray voltage corresponding to each image data DAT among the gray voltages supplied from the gray voltage generator 800. That is, the data driver 500 converts the digital image data signals, DAT into the corresponding data voltages, and applies the analog gray scale voltages to the corresponding data lines D1 to Dm for each activated row of pixels (activated by the gate-on voltage Von).

The gate driver 400 sequentially applies the gate-on voltage Von as a pulse of substantially rectangular waveform (see briefly g1 of timing FIG. 3) to successive ones of the gate line G1-G2n in response to the scanning control signals CONT1 supplied from the signal controller 600, thereby turning on the switching elements connected thereto. The data voltages applied to the data lines D1-Dm at that time are then supplied to the corresponding pixels PX through the turned-on switching elements.

The difference between the data voltages applied to the pixels and the common voltage Vcom is referred to herein as the charged voltage, i.e., also known in the art as the pixel voltage or pixel-electrode voltage. For example, in a case where the display is a liquid crystal display, the arrangements of liquid crystal molecules in the liquid crystal layer are changed depending on the magnitude of the pixel voltage, thereby changing the polarization of light passing through the liquid crystal layer 3. This change of the polarization is then converted into a change of light transmittance by use of additional polarizers or other optical elements attached to the display panel.

Next, an operation of a thin film transistor array panel and a display device including the same according to an exemplary embodiment of the present disclosure will be described with reference to FIG. 2 and FIG. 3 in more detail.

Figure 2:
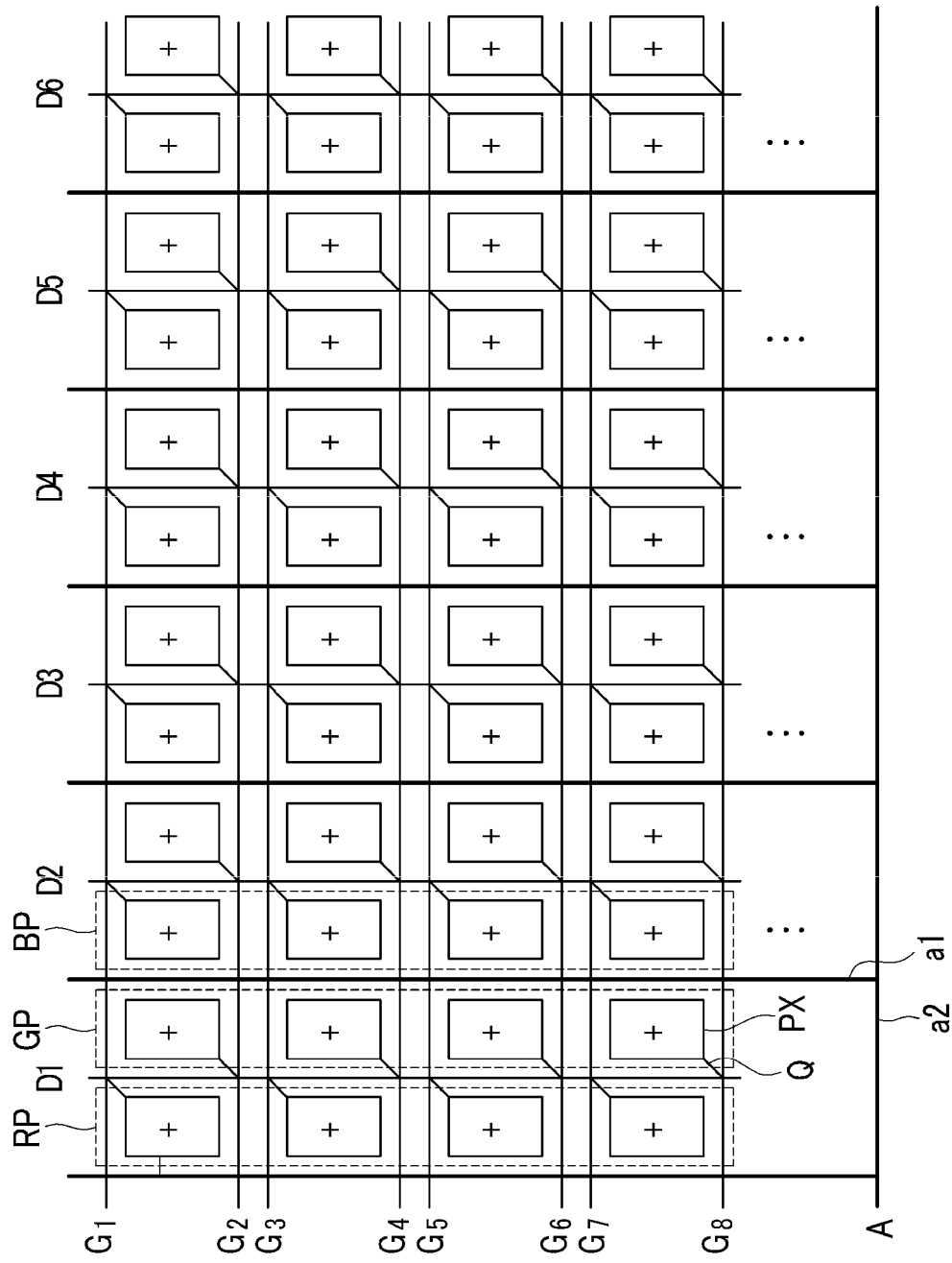
FIG. 2 is a view showing the case when a first polarity of per frame reversed polarity voltages are applied to the data lines and the pixel electrodes of a display device according to an exemplary embodiment.

FIG. 2 is a view showing a case where a first polarity of a voltage (positive) is applied to the data lines and from there to the pixel electrodes of the display device according to an exemplary embodiment. FIG. 3 is a waveform and signal timing graph showing how and when gate signals (g1-g2n) and the distribution voltage, Va are applied relative to when the data line signals of a respective gate line-controlled row of pixels are valid and ready to be latched in the display device of FIG. 2 wherein the positive polarity is being used during a corresponding frame refresh time.

Referring to the arrangement of pixel units shown in FIG. 2, the first column pixels are red pixels RP, the second column are green pixels GP, the third column of pixels are blue pixel BP, and the arrangement of the red, green, and blue pixels RP, GP, and BP is repeated horizontally across the screen. This particular pixel arrangement is referred to as "a vertically striped arrangement".

When the polarity of the data voltages applied to the data lines D1 to Dm and the pixels PX in one frame is positive (as is the case in FIG. 2), the voltage Va applied to the common signal distribution line A should have a negative polarity. In contrast, when the polarity of the data voltages applied to the data lines D1 to Dm and the pixels PX in the next frame is negative, the voltage Va applied to the common signal distribution line A should have positive polarity. Here, the voltage Va applied to the common signal distribution line A may be a DC voltage, and the absolute value magnitude thereof may be determined with reference to an RMS (root-mean-square) value of the then applied data voltages. Accordingly, the current consumption of the display device may be reduced.

Figure 3:
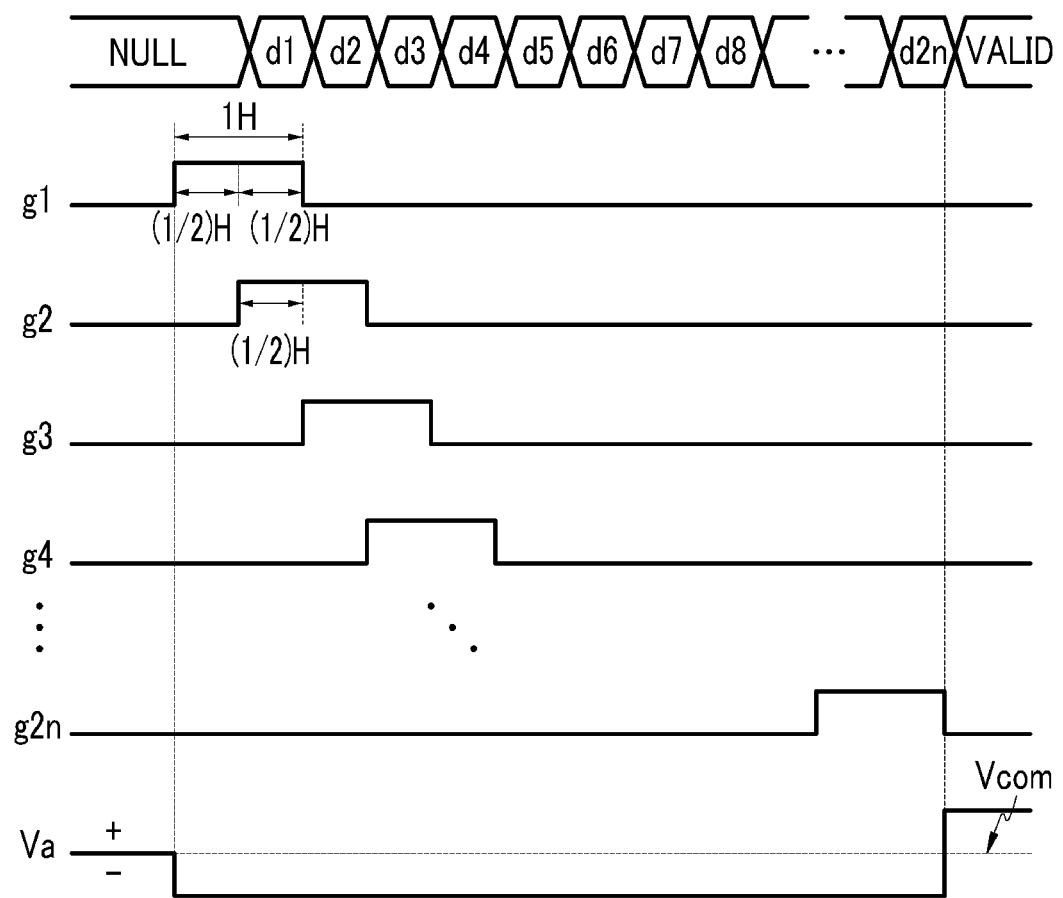
FIG. 3 is a timing graph showing timings and durations of gate turn-on pulses relative to when corresponding data voltages of the frame are valid for application to pixel-electrodes of the display device of FIG. 2.

As shown in FIG. 3, a next gate line (e.g., g1, g2, etc.) is activated by operations the gate driver 400 every half horizontal period ("H/2"), where H is equal to one cycle of the horizontal synchronizing signal Hsync and of the data enable signal DE. The supplied data line voltages are latched into the gate line activated pixel units at the falling edge of the respective Von pulse. Through this method, the gate-on voltage Von is sequentially applied to all the gate lines G1 to G2n and the data voltages are applied to and timely latched into all of the pixel units PX. When the next frame starts after a first frame is completed, the state of the inversion signal applied to the data driver 500 is controlled such that the polarity of the data signal applied to each pixel is inverted with respect to the polarity of the previous frame ("frame inversion").

Aside from per frame polarity reversals, the polarity of the data voltage that flows in a data line may be inverted (for example, row inversion and dot inversion) or the polarities of the data voltages that are applied to a row of pixels may vary (for example, column inversion and dot inversion), according to the characteristic of the inversion signal. For example, the driver inversion is column inversion in which the polarity of the data voltages in each data line is fixed and the polarities of the data voltages in two adjacent data lines are opposite, and an apparent inversion is 1×2 dot inversion. Here, the driver inversion is the inversion in the data driver 500, and the apparent inversion is the inversion that appears in pixels PX. In this way, if the apparent inversion is the dot inversion, when the difference of the pixel luminance that is generated by a kick-back voltage when the pixel voltage is the positive polarity and the negative polarity is dispersed such that the vertical line deteriorations may be reduced.

In FIG. 3, $g_i$ (i=1, 2, . . . , 2n) indicates the gate signal applied to the i-th gate line G1, and d1, d2, . . . , d2n indicate when valid data voltage levels are sequentially applied to one of the data lines D1, D2, D3, . . . in FIG. 2.

The durations that the gate lines G1 to G(2n) are applied with the gate-on voltage Von is 1H, and the time that the two adjacent gate lines G1 to G(2n) are applied with the gate-on voltage Von overlaps during (½)H. Here, the target data voltages that will be applied to the pixels connected to the gate lines G1 to G(2n) are applied during the second half of 1H.

Accordingly, when the even-numbered row gate lines $G_{2i}$ are applied with the gate-on voltage Von at the time of t=(½)H after the odd-numbered row gate lines $G_{2i-1}$ are applied with gate-on voltage Von from t=0 to t=(½)H, the pixels connected to the even-numbered row gate lines $G_{2i}$ are applied with the data voltages applied to the pixels connected to the odd-numbered row gate lines $G_{2i-1}$, and maintain the applied data voltages from t=(½)H to t=1H such that the pixel connected to the even-numbered row gate lines $G_{2i}$ is preliminarily charged.

Next, when the time is t=1H after the odd-numbered row gate lines $G_{2i-1}$ finish to be applied with the gate-on voltage Von, the odd-numbered row gate lines $G_{2i-1}$ are not applied with the gate-on voltage Von, but with the gate-off voltage Voff, and the even-numbered row gate lines $G_{2i}$ are continuously applied with the gate-on voltage Von from time 1H to (3/2)H. During a period from 1H to (3/2)H, the pixels connected to the even-numbered row gate lines $G_{2i}$ are applied with the data voltage and are normally charged to the target voltage. Since the pixels are already preliminarily charged (pre-charged) at least with the proper polarity during the first half of 1H, the charging time to the target voltage may be reduced.

Accordingly, the reduced charging time of the pixels may be compensated as the number of the data lines is reduced to half, and the number of gate lines is increased to twice to make up for the need to charge twice as many pixel rows per data line.

Next, a thin film transistor array panel and a display device including the same according to another exemplary embodiment of the present disclosure will be described with reference to FIG. 4. The overlapping description with FIG. 1 to FIG. 3 is omitted.

Figure 4:
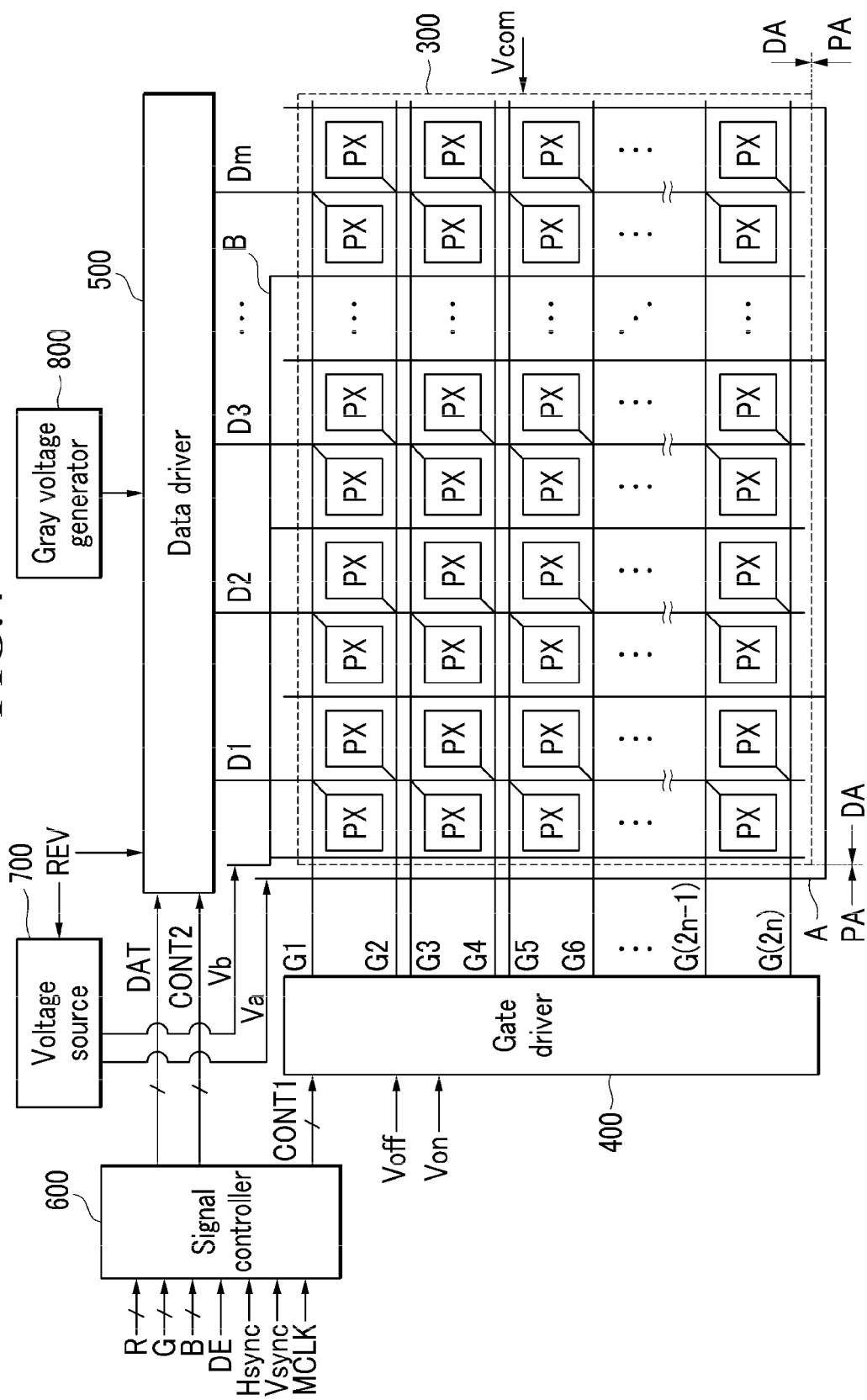
FIG. 4 is a block diagram of a display device including a thin film transistor array panel according to another exemplary embodiment that has 'A' and 'B' common signal distribution lines.

FIG. 4 is a block diagram of a display device including a thin film transistor array panel according to another exemplary embodiment of the present disclosure.

In FIG. 4, each of a first common signal distribution line 'A' and a second common signal distribution line 'B' are alternately disposed between the adjacent data lines D1 to Dm and respectively connected to receive corresponding voltages Va and Vb. For example, the first common signal distribution line 'A' may be disposed after every four pixels in the horizontal direction, such as between the second and third pixel columns and then between the sixth and seventh pixel columns. The data lines D1 to Dm are not disposed in between the pixel columns (e.g., between the second and third columns) where the vertical branches of the 'A' common signal distribution line are disposed. Similarly, branches of the second common signal distribution line 'B' are disposed after every four pixels in the horizontal direction, such as between the fourth and fifth pixel columns. Once again, the data lines D1 to Dm are not be disposed between pixel columns (e.g., between the fourth and fifth columns) where the vertical branches of the 'B' common signal distribution line are disposed.

Looking at each column of pixel units taken by itself, it may be observed that a respective one of the data lines D1 to Dm is disposed at either the right or the left side of that pixels column and that either the first common signal distribution line A or the second common signal distribution line B is disposed at the other side. The data lines D1 to Dm and the common signal distribution lines A and B that are disposed at the right and left sides of one pixel PX are symmetrical such that the influence of the data lines D1 to Dm for the pixel PX and the influence of the common signal distribution lines A and B for the pixel PX may be offset (e.g., cancel one another out in terms of electrostatic influence over pixel-electrodes between them). Accordingly, the data voltage applied to the pixel PX may receive little influence of the parasitic capacitance, thereby reducing the vertical blurs of the display device. Also, the pixel voltage is little changed by the symmetry of the data lines D1 to Dm and the common signal distribution lines A and B, thereby reducing the generation of the gradual greenish hue and the gradual reddish hue.

When the polarity of the data voltages applied to the data lines D1 to Dm and the pixels PX in one frame is positive, then the voltage Va applied to the first common signal distribution line A and the voltage Vb applied to the second common signal distribution line B may have negative polarity. In contrast, when the polarity of the data voltages applied to the data lines D1 to Dm and the pixels PX in the next frame is negative, then the voltage Va applied to the first common signal distribution line A and the voltage Vb of the second common signal distribution line B may have positive polarity. Here, the voltage Va applied to the first common signal distribution line A and the voltage Vb of the second common signal distribution line B may be different DC voltages, and the absolute value magnitude of each may be determined with reference to an RMS (root-mean-square) value of the common voltage Vcom or the data voltage. Accordingly, the current consumption of the display device may be reduced.

Figure 7:
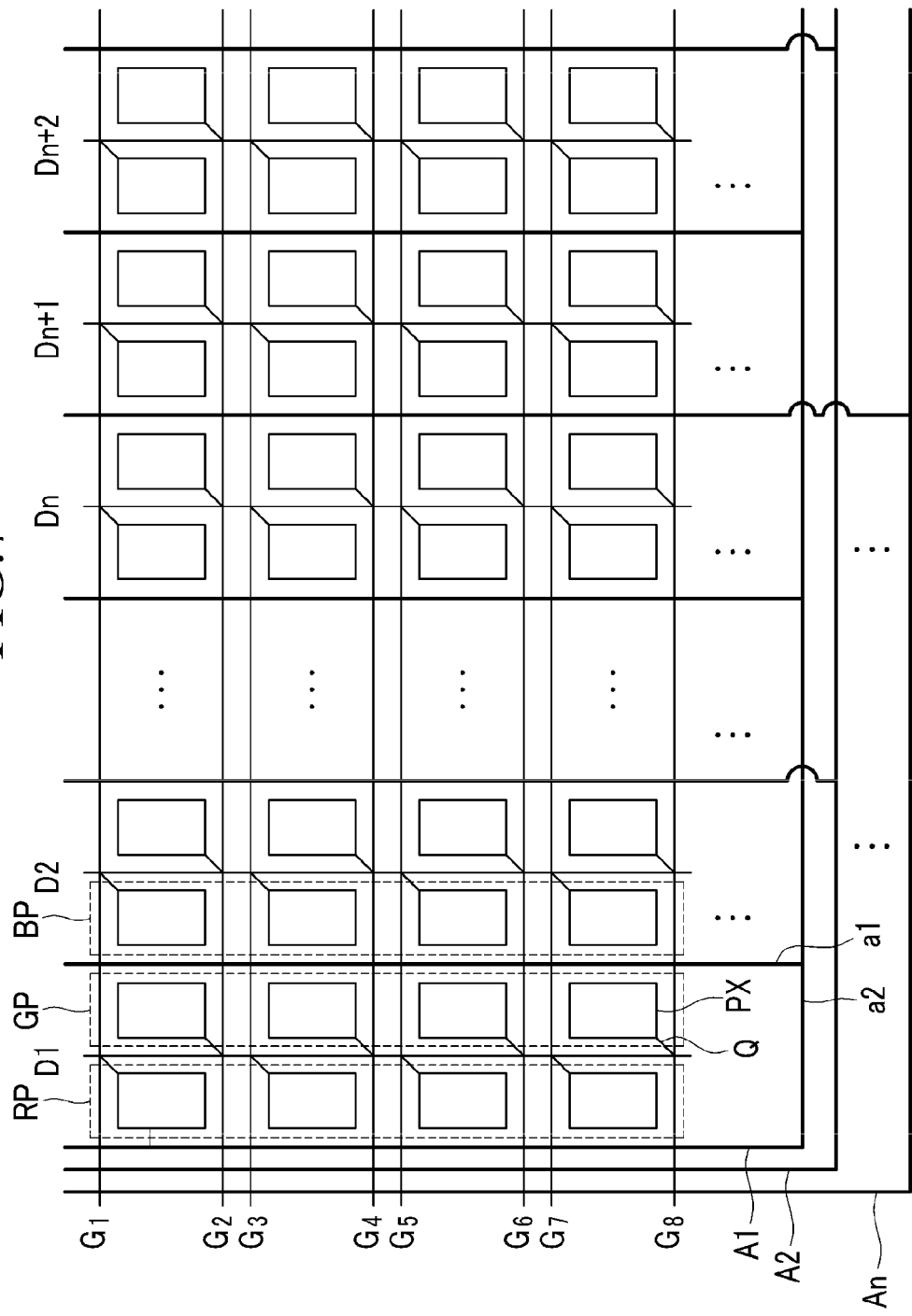
FIG. 7 is a block diagram of a display device according to another exemplary embodiment.

Next, as seen in FIG. 7, there are n number of the common signal distribution lines A1 to An, where n is a natural number greater than 1. Here, horizontal branches of the common signal distribution lines A1 to An are disposed in the same side with reference to the pixels PX. For example, when n is 2, horizontal branches of the common signal distribution lines A1 and A2 are disposed in the same side, unlike horizontal branches in FIG. 4. However, vertical branches of the common signal distribution lines A1 and A2 are disposed similar to vertical branches in FIG. 4, and a voltage driving may also be similar to a voltage driving in FIG. 4. A horizontal branch of the common signal distribution line A1 and vertical lines of the common signal distribution line A2 may be insulated from each other to avoid a short. For example, a connection member may be used as a bridge to connect both edge portions of a vertical branch through contact holes, and here, the both edge portions faces each other with reference to the horizontal branch of the common signal distribution line A1. The connection member may include a transparent conductive material such as ITO or IZO.

Next, a liquid crystal display including a thin film transistor array panel according to another exemplary embodiment of the present disclosure will be described with reference to FIG. 5 and FIG. 6. The overlapping description with FIG. 1 to FIG. 4 is omitted.

Figure 5:
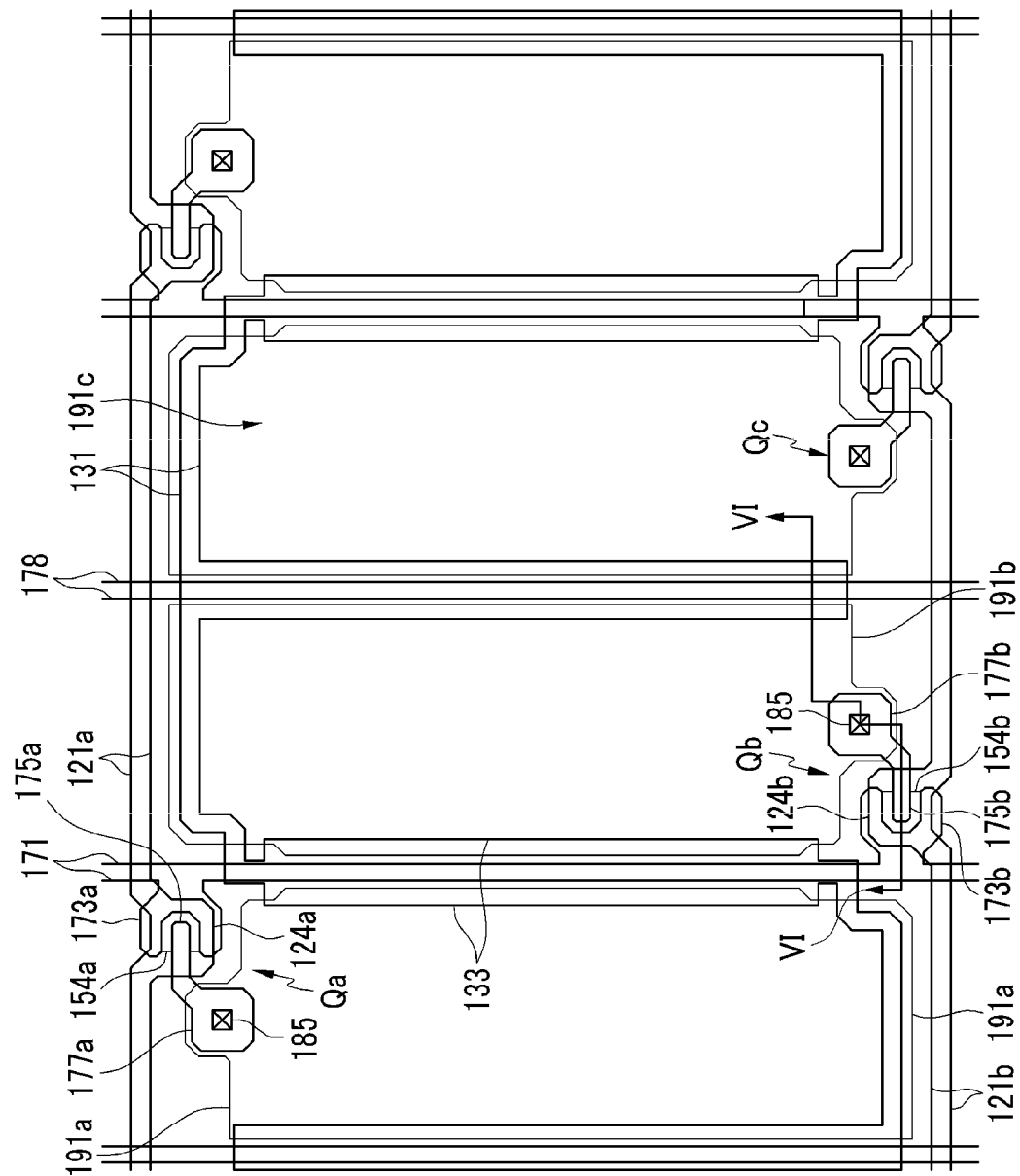
FIG. 5 is a layout view of a liquid crystal display according to an exemplary embodiment.
Figure 6:
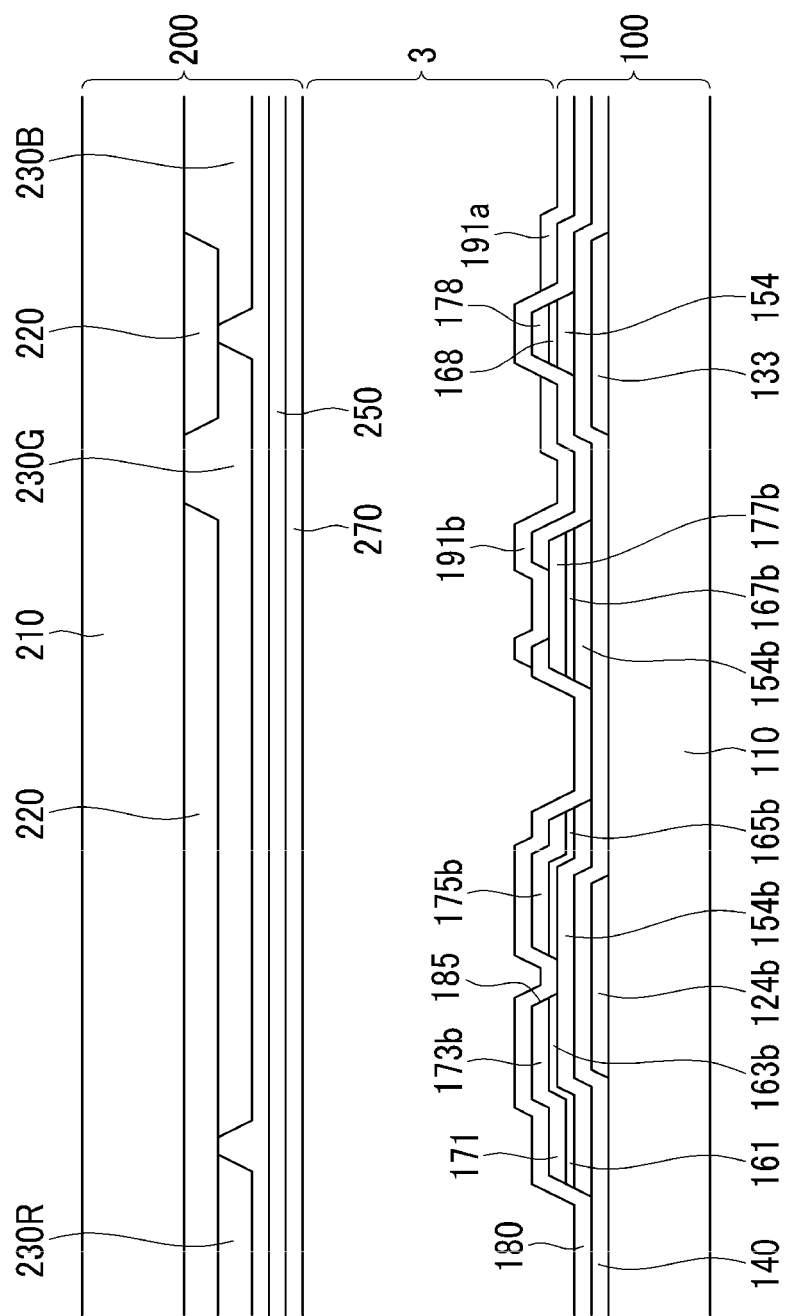
FIG. 6 is a cross-sectional view of the liquid crystal display shown in FIG. 5 taken along the sectional line VI-VI of FIG. 5.

FIG. 5 is a layout view of a liquid crystal display according to an exemplary embodiment of the present disclosure, and FIG. 6 is a cross-sectional view of the liquid crystal display shown in FIG. 5 taken along the line VI-VI.

Reference will be made here to at least a first transistor Qa and a second transistor Qb disposed in respective and adjacent pixel units whose pixel-electrodes are denoted as 191a and 191b respectively. Gate lines 121a and 121b, gate electrodes 124a and 124b, a storage electrode lines 131, and storage electrodes 133 are disposed on a transparent insulating substrate 110 where the latter may include a material such as glass or plastic. The upper and lower gate lines, 121a and 121b, respectively transmit upper and lower gate signals to corresponding transistors Qa and Qb. The gate lines 121a,b extend in an approximate row direction, and include the plurality of gate electrodes 124a and 124b that are protruded from the respective gate lines. Because one gate line 121a is disposed above its given row of pixel units in the pixel array and the other gate line 121b is disposed above its given row, when the rows are stacked one above the next on the plane of FIG. 5, two gate lines will be disposed between pairs of rows in the pixels array.

The storage electrode feeding line 131 receives a predetermined storage assisting voltage, and it extends to include the storage electrode 133. The storage electrode line 131 is approximately parallel to the gate lines 121a and 121b, and the storage electrode 133 extends to be approximately parallel to a data line 171 (or a common voltage distribution line 178 as shall be seen below). The storage electrode line 131 overlaps the pixel electrodes 191a and 191b, and the storage electrode 133 overlaps the data line 171 and the pixel electrodes 191a and 191b. Here, the shape and arrangement of the storage electrode line 131 and the storage electrode 133 may be variously changed. Further, the storage electrode line 131 and the storage electrode 133 may be omitted.

The gate lines 121a and 121b and the storage electrode line 131 may include an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), titanium (Ti), etc. Also, the gate lines 121a and 121b and the storage electrode line 131 may include a transparent conductive material such as indium tin oxide (ITO), indium zinc oxide (IZO), and aluminum doped ZnO (AZO). The gate lines 121a and 121b and the storage electrode line 131 may have a multi-layered structure including two conductive films (e.g., one each of a low resistance metal and of a higher resistivity transparent conductive material, where the multilayer conductor structure is not shown).

A gate insulating layer 140 is disposed on the gate lines 121a and 121b and the storage electrode line 131. The gate insulating layer 140 may include a silicon nitride (SiNx), a silicon oxide (SiOx), and/or an organic insulating material. The gate insulating layer 140 may have a multi-layered structure including at least two insulating layers (not shown).

A plurality of semiconductor regions 154, 154a and 154b may be provided and may include a hydrogenated amorphous silicon (a-Si is an abbreviation for amorphous silicon), a polysilicon, or so on and these semiconductive regions may be formed on the gate insulating layer 140.

Ohmic contacts 161, 163b, 165b, 167b, and 168 are disposed on the semiconductor regions 154, 154a, and 154b. The ohmic contacts 161, 163b, 165b, 167b, and 168 may include a material such as n+ hydrogenated amorphous silicon in which an n-type impurity such as phosphor is doped with a high density, or may include a silicide.

A data line 171, drain electrodes 175a and 175b, and a common signal distribution line 178 are positioned on the semiconductors 154a and 154b. The data line 171 transmits the data voltage, and extends in an approximate column direction thereby intersecting the gate lines 121a and 121b. The data line 171 includes source electrodes 173a and 173b having a curved shape on the gate electrodes 124a and 124b. Also, the shape of the source electrodes 173a and 173b may be varied.

The common signal distribution line 178 is disposed at the same layer as the data line 171, is disposed between the pixel electrodes 191a and 191b, and is parallel to the data line 171. For example, among the plurality of pixel electrodes disposed in the row direction, a respective one of the data lines 171 and the common signal distribution line 178 is positioned on a mutually exclusive basis between the pixel electrodes 191a and 191b. In other words, the data line 171 and the common signal distribution line 178 are alternatingly disposed. The common signal distribution line 178 is insulated from and intersects the gate lines 121a and 121b. The plurality of common signal distribution lines 178 are connected into one major distribution line in the peripheral area PA of the liquid crystal display, thereby receiving one common voltage. Also, the common signal distribution lines 178 may be divided into two (A and B sets), and may be connected to each other in the peripheral area PA of the liquid crystal display.

The data lines 171 and the common signal distribution lines 178 that are disposed at the right and left sides of the pixel electrodes 191a and 191b are symmetrical such that the influence of the data lines 171 for the pixel electrode 191a and 191b and the influence of the common signal distribution line 178 for the pixel electrodes 191a and 191b may be offset (substantially cancel each other's electrostatic influence on the pixel unit in between). Accordingly, the voltage applied to the pixel electrodes 191a and 191b may receive little influence of the parasitic capacitance, thereby reducing the vertical blurs of the display device. Also, the pixel electrode voltage is little changed due to the opposed voltage polarities and the symmetrically opposed positioning of the data line 171 and the common signal distribution line 178 about the pixel column, thereby reducing the generation of a gradual greenish hue and a gradual reddish hue.

The drain electrodes 175a and 175b are separated from the data lines 171, and include a narrow portion and wide portions 177a and 177b. The narrow portion includes an end portion enclosed by the source electrodes 173a and 173b, and the wide portions 177a and 177b are approximately quadrangular.

The data line 171, the source electrodes 173a and 173b, the drain electrodes 175a, 175b, 177a, and 177b, and the common signal distribution line 178 may include a metal such as an aluminum-containing metal of aluminum (Al) or an aluminum alloy, a silver-containing metal of silver (Ag) or a silver alloy, a copper-containing metal of copper (Cu) or a copper alloy, a molybdenum-containing metal of molybdenum (Mo) or a molybdenum alloy, chromium (Cr), tantalum (Ta), and titanium (Ti). Examples of the molybdenum alloy may be Mo—Nb and Mo—Ti. Also, the data line 171, the source electrodes 173a and 173b, the drain electrodes 175a, 175b, 177a, and 177b, and the common signal distribution line 178 may include a transparent conductive material such as ITO, IZO, and AZO. The data line 171, the source electrodes 173a and 173b, the drain electrodes 175a, 175b, 177a, and 177b, and the common signal distribution line 178 may include a multilayered structure including at least two conductive layers (not shown).

On the other hand, the respective gate electrodes 124a and 124b, the source electrodes 173a and 173b, and the drain electrodes 175a and 175b form respective thin film transistors Qa and Qb along with the semiconductors 154a and 154b, and the channels of the thin film transistors are formed in the semiconductors 154a and 154b between the source electrodes 173a and 173b and the drain electrodes 175a and 175b. The drain electrodes 175a and 175b are connected to the pixel electrodes 191a and 191b, thereby applying the driving voltage to the pixel-electrodes.

The data line 171, the source electrodes 173a and 173b, the drain electrodes 175a, 175b, 177a, and 177b, and the common signal distribution line 178 may be in substantially the same plane (same layers) as the semiconductors 154, 154a, and 154b that are disposed with different layers from each other. However, data line 171, the source electrodes 173a and 173b, the drain electrodes 175a, 175b, 177a, and 177b, and the common signal distribution line 178 do not cover channel portions of respective thin film transistors.

A passivation layer 180 including a silicon nitride (SiNx) or a silicon oxide (SiOx) is positioned on the data line 171 and the drain electrodes 175a and 175b. The passivation layer 180 may include an organic insulating material. The passivation layer 180 has a contact hole 185 exposing the drain electrodes 177a and 177b. The pixel electrodes 191a and 191b and the drain electrodes 177a and 177b are connected to each other through the contact hole 185.

The pixel electrodes 191a and 191b are disposed on the passivation layer 180. The pixel electrodes 191a and 191b may include the transparent conductive oxide such as ITO and IZO.

A liquid crystal layer 3 is positioned between the first display panel 100 including the thin film transistors and the second display panel 200 facing the first display panel 100. The liquid crystal layer 3 may have positive or negative dielectric anisotropy, and the liquid crystal molecules of the liquid crystal layer 3 are aligned such that the long axis of the liquid crystal molecules may be arranged parallel or perpendicular to the surface of the first and second display panels 100 and 200 when an electric field is not applied.

At least one alignment layer (not shown) may be formed on an inner surface of the first and second display panels 100 and 200, and may be a vertical or horizontal alignment layer. A light polarizer (not shown) may be provided on the outer surface of the first and the second display panels 100 and 200.

A light blocking member 220 is positioned on the second substrate 210. The light blocking member 220 is referred to as a black matrix, and helps prevent light leakage between pixel units.

Color filters 230R, 230G, and 230B are positioned on the light blocking member 220. The color filters 230R, 230G, and 230B may have a belt shape between the adjacent data lines 171. The color filters 230R, 230G, and 230B may include pigments representing red, green, or blue, and a photosensitive organic material (e.g., PR, photoresist).

An overcoat 250 is positioned on the color filters 230R, 230G, and 230B. The overcoat 250 may include the inorganic insulating material and the organic insulating material.

A common electrode 270 is formed on the overcoat 250. The common electrode 270 may include the transparent conductive oxide such as ITO and IZO.

The pixel electrodes 191a and 191b are connected to the drain electrodes 175a and 175b of the respective thin film transistors Qa/Qb through the contact hole 185, thereby receiving the data voltage from the drain electrodes 175a and 175b. The pixel electrodes 191a and 191b to which the data voltage are applied generate an electric field along with the common electrode 270 of the second display panel 200, thereby determining the orientation of liquid crystal molecules of the liquid crystal layer 3 between the electrodes 191a and 191b, and 270. The luminance of light that passes through the liquid crystal layers is changed according to the orientation of the liquid crystal molecules.

The pixel electrodes 191a and 191b and the common electrode 270 constitute a liquid crystal capacitor that maintains a voltage applied thereto even after the thin film transistor is turned off.

The pixel electrodes 191a and 191b overlap the storage electrode 133 and the storage electrode line 131 thereby forming a storage capacitor for helping to preserve the charged state of the pixel-electrode.

While this disclosure has been described in connection with what are presently considered to be practical exemplary embodiments, it is to be understood that the disclosure and its teachings are not limited to the disclosed embodiments, but, on the contrary, the teachings are intended to cover various modifications and equivalent arrangements as may become apparent to those skilled in the art in light of the spirit and scope of the foregoing.

What is claimed is:

1. A thin film transistor panel comprising:
   a first pixel unit disposed in a display area and comprising a first thin film transistor and a first pixel electrode;
   a second pixel unit disposed in the display area and comprising a second thin film transistor and a second pixel electrode, the second pixel being adjacent to the first pixel unit in a first direction;
   a first data line and a second data line extending in a second direction and electrically connected to the first pixel unit and the second pixel unit, respectively; and
   a common signal distribution line including a first branch and a second branch that are connected to each other,
   wherein the first branch is disposed between the first pixel unit and the second pixel unit and extends substantially in the second direction,
   the second branch is disposed in a peripheral area outside the display area and includes a portion extending substantially in the second direction.

2. The thin film transistor panel of claim 1, wherein the first data line and the second data line are configured to receive a plurality of data voltages during one frame and the common signal distribution line is configured to receive a common voltage during the same one frame.

3. The thin film transistor panel of claim 2, wherein polarities of the data voltages are inverted per one frame.

4. The thin film transistor panel of claim 3, wherein the polarities of the data voltages applied to the first pixel unit and the second pixel unit during the one frame are different each other.

5. The thin film transistor panel of claim 1, wherein the first pixel unit and the second pixel unit are disposed in a display area.

6. The thin film transistor panel of claim 1, wherein the common signal line is disposed at the same layer as the first data line and the second data line.

7. The thin film transistor panel of claim 6, wherein the first data line and the second data line are configured to receive a plurality of data voltages during one frame and the common signal distribution line is configured to receive a common voltage during the same one frame.

8. The thin film transistor panel of claim 7, wherein polarities of the data voltages are inverted per one frame.

9. The thin film transistor panel of claim 8, wherein the polarities of the data voltages applied to the first pixel unit and the second pixel unit during the one frame are different each other.

10. The thin film transistor panel of claim 6, wherein the first pixel unit and the second pixel unit are disposed in a display area.

11. The thin film transistor panel of claim 1, wherein the first data line, the second data line, and the first branch comprise the same metal.

12. The thin film transistor panel of claim 11, wherein the metal comprises at least one of an aluminum-based metal of aluminum (Al) or aluminum alloys.

13. The thin film transistor panel of claim 1, wherein the common signal distribution line is electrically separated from a data driver which is connected to the first data line and the second data line.

14. The thin film transistor panel of claim 1, wherein the first gate line is configured to receive a first gate-on signal, wherein the second gate line is configured to receive a second gate-on signal, wherein the first gate-on signal starts earlier than the second gate-on signal, and wherein application of the first gate-on signal overlaps application of the second gate-on signal for a predetermined time interval.

15. The thin film transistor panel of 14, wherein each of the first gate-on signal and the second gate-on signal is applied for the same horizontal scanning period (1H).

16. The thin film transistor panel of claim 1, wherein the display area is configured to display images, and wherein the peripheral area is disposed along a peripheral edge of the display area.

17. The thin film transistor panel of claim 1, wherein the portion of the second branch that extends substantially in the second direction is disposed in the peripheral area and is disposed adjacent to the first branch, which is disposed in the display area.

* * * * *